United States Patent
Joshi

(10) Patent No.: US 8,609,978 B2
(45) Date of Patent: Dec. 17, 2013

(54) LEADFRAME BASED PHOTO VOLTAIC ELECTRONIC ASSEMBLY

(75) Inventor: Rajeev Joshi, Cupertino, CA (US)

(73) Assignee: Flextronics AP, LLC, Broomfield, CO (US)

( * ) Notice: Subject to any disclaimer, the term of this patent is extended or adjusted under 35 U.S.C. 154(b) by 388 days.

(21) Appl. No.: 12/069,094

(22) Filed: Feb. 6, 2008

(65) Prior Publication Data

US 2008/0190480 A1    Aug. 14, 2008

Related U.S. Application Data

(60) Provisional application No. 60/901,377, filed on Feb. 14, 2007.

(51) Int. Cl.
*H01L 31/042* (2006.01)

(52) U.S. Cl.
USPC ........... 136/246; 136/244; 136/251; 136/259; 136/256; 250/239

(58) Field of Classification Search
USPC ........... 136/246, 244, 251, 259, 256; 250/239
See application file for complete search history.

(56) References Cited

U.S. PATENT DOCUMENTS

| | | | |
|---|---|---|---|
| 2,415,688 A | 2/1947 | Hall, Jr. | 219/25 |
| 2,483,815 A | 10/1949 | Easton | 175/356 |
| 2,967,267 A | 1/1961 | Steinman et al. | 317/101 |
| 3,277,358 A | 10/1966 | Nicholl | 320/59 |
| 3,292,579 A | 12/1966 | Buchanan | 119/5 |
| 3,329,880 A | 7/1967 | Boyles | 320/2 |
| 3,418,552 A | 12/1968 | Holmes | 320/2 |
| 3,489,615 A * | 1/1970 | Mann | 136/256 |
| 3,549,990 A | 12/1970 | Hochheiser | 323/44 |
| 3,641,336 A | 2/1972 | Boin | 240/10.6 R |
| 3,663,954 A | 5/1972 | Alker | |
| 3,772,625 A | 11/1973 | Raupach | 336/94 |
| 3,840,795 A | 10/1974 | Roszyk et al. | 320/2 |
| 3,885,211 A | 5/1975 | Gutai | 320/2 |
| 3,938,018 A | 2/1976 | Dahl | 320/2 |
| 3,939,391 A | 2/1976 | Winnacker | 320/2 |
| 3,988,604 A | 10/1976 | Raymond, Jr. | |
| 4,030,058 A | 6/1977 | Riffe et al. | 336/92 |
| 4,038,625 A | 7/1977 | Tompkins et al. | 336/83 |
| 4,146,857 A | 3/1979 | Schleupen | 336/61 |
| 4,260,943 A | 4/1981 | Zaderej et al. | 320/21 |
| 4,303,902 A | 12/1981 | Lesster et al. | 336/83 |
| 4,359,487 A * | 11/1982 | Schneider | 427/75 |
| 4,496,896 A | 1/1985 | Melocik et al. | 320/2 |

(Continued)

FOREIGN PATENT DOCUMENTS

| JP | 2001-036120 A * | 2/2001 |
|---|---|---|
| JP | 2006-313809 | * 11/2006 |

OTHER PUBLICATIONS

JP2006-313809, Uozumi, Nov. 16, 2006, Machine Translation.*
Ueda, JP2001-036120A, Machine Translation, Feb. 2001.*

(Continued)

*Primary Examiner* — Devina Pillay
(74) *Attorney, Agent, or Firm* — Haverstock & Owens LLP

(57) ABSTRACT

A leadframe based photovoltaic assembly and method for assembling the same is disclosed. The photovoltaic assembly comprises a first and second mold compounds to effectuate the accurate placement of an optical concentrator above a photovoltaic cell. The photovoltaic assembly is able to be assembled using existing mature semiconductor packaging technologies.

27 Claims, 9 Drawing Sheets

(56) References Cited

U.S. PATENT DOCUMENTS

| | | | |
|---|---|---|---|
| 4,543,556 A | 9/1985 | Taylor et al. ................ 336/210 |
| 4,654,573 A | 3/1987 | Rough et al. ..................... 320/2 |
| 4,800,328 A | 1/1989 | Bolger et al. ..................... 320/2 |
| 4,827,550 A | 5/1989 | Graham et al. ............... 15/22 R |
| 4,827,551 A | 5/1989 | Maser et al. ...................... 15/24 |
| 4,827,552 A | 5/1989 | Bojar et al. ........................ 15/28 |
| 4,830,678 A * | 5/1989 | Todorof et al. ............... 136/259 |
| 4,834,805 A * | 5/1989 | Erbert ............................ 136/246 |
| 4,845,795 A | 7/1989 | Crawford et al. ............. 15/22 R |
| 4,845,796 A | 7/1989 | Mosley ............................. 15/23 |
| 4,893,227 A | 1/1990 | Gallios et al. .................. 363/26 |
| 4,912,391 A | 3/1990 | Meadows ........................... 320/2 |
| 4,942,352 A | 7/1990 | Sano .................................. 320/2 |
| 5,070,293 A | 12/1991 | Ishii et al. ......................... 320/2 |
| 5,087,962 A * | 2/1992 | deVos et al. .................. 257/671 |
| 5,125,983 A * | 6/1992 | Cummings ................... 136/246 |
| 5,157,319 A | 10/1992 | Klontz et al. ..................... 320/2 |
| 5,216,402 A | 6/1993 | Carosa .......................... 336/66 |
| 5,264,776 A | 11/1993 | Hulsey .............................. 320/2 |
| 5,460,659 A * | 10/1995 | Krut .............................. 136/246 |
| 5,479,083 A | 12/1995 | Brainard |
| 5,498,297 A * | 3/1996 | O'Neill et al. ................ 136/246 |
| 5,498,948 A | 3/1996 | Bruni et al. |
| 5,580,395 A * | 12/1996 | Yoshioka et al. ............. 136/255 |
| 5,590,214 A | 12/1996 | Nakamura |
| 5,673,185 A | 9/1997 | Albach et al. |
| 5,763,941 A * | 6/1998 | Fjelstad ........................ 257/669 |
| 5,790,395 A | 8/1998 | Hagen |
| 5,811,895 A | 9/1998 | Suzuki et al. ................. 307/125 |
| 5,834,842 A * | 11/1998 | Majumdar et al. ............ 257/718 |
| 5,850,181 A | 12/1998 | Heinrich et al. .............. 340/572 |
| 5,923,543 A | 7/1999 | Choi ................................ 363/21 |
| 5,986,600 A | 11/1999 | McEwan |
| 6,040,680 A | 3/2000 | Toya et al. |
| 6,051,776 A * | 4/2000 | Kimata et al. ................. 136/246 |
| 6,127,799 A | 10/2000 | Krishnan |
| 6,275,397 B1 | 8/2001 | McClain |
| 6,379,988 B1 * | 4/2002 | Peterson et al. ................ 438/51 |
| 6,437,549 B1 | 8/2002 | Takagishi |
| 6,469,241 B1 | 10/2002 | Penn ............................ 136/246 |
| 6,487,098 B2 | 11/2002 | Malik et al. |
| 6,541,694 B2 * | 4/2003 | Winston et al. ............... 136/246 |
| 6,548,985 B1 | 4/2003 | Hayes et al. |
| 6,906,495 B2 | 6/2005 | Cheng et al. |
| 6,972,543 B1 | 12/2005 | Wells |
| 7,151,357 B2 | 12/2006 | Xian et al. |
| 7,164,255 B2 | 1/2007 | Hui |
| 7,511,452 B2 | 3/2009 | Bersenev |
| 2002/0011823 A1 | 1/2002 | Lee ................................ 320/137 |
| 2002/0011922 A1 | 1/2002 | Wuidart |
| 2003/0035303 A1 | 2/2003 | Balakrishnan et al. ......... 363/16 |
| 2004/0105364 A1 | 6/2004 | Chow et al. ................. 369/47.19 |
| 2004/0126932 A1 | 7/2004 | Ito et al. ........................ 438/123 |
| 2005/0037538 A1 * | 2/2005 | Minamio et al. .............. 438/106 |
| 2005/0156563 A1 | 7/2005 | Lin et al. |
| 2005/0275629 A1 | 12/2005 | Chin |
| 2005/0286660 A1 | 12/2005 | Nysen et al. ................... 375/343 |
| 2006/0022636 A1 | 2/2006 | Xian et al. .................... 320/108 |
| 2006/0055620 A1 | 3/2006 | Oliver et al. .................. 343/876 |
| 2006/0196642 A1 | 9/2006 | Gharib et al. ............ 165/104.28 |
| 2007/0012353 A1 | 1/2007 | Fisher et al. .................. 136/251 |

OTHER PUBLICATIONS

Hang-Seok Choi et al., Novel Zero-Voltage and Zero-Current Switching (ZVZCS) Full-Bridge PWM Converter Using Coupled Output Inductor, Sep. 2002 IEEE, pp. 641-648.

"Electromagnetic Fields," Consumer Reports, May 1994, pp. 354-359.

"Exposure to Residential Electric and Magnetic Fields and Risk of Childhood Leukemia" University of Southern California, Electric Power Research Institute EN-7464, Project 2964-1, Interim Report (Report Summary only), Nov. 1991.

"Exploring the Options for Magnetic Field Management," EPRI Journal, Oct./Nov. 1990, pp. 5-19.

Gordon Miller "Exposure Guidlines for Magnetic Fields," American Industrial Hygiene Association Journal, Dec. 1987, vol. 48, pp. 957-968.

J. R. Gauger, "Household Appliance Magnetic Field Survey," IEEE Transactions on Power Apparatus and Systems, Sep. 1985, vol. PAS-104, No. 9.

"Design of a Contactless Battery Charger for Cellular Phone", Chang-Gyun Kim et al., School of Electrical Engineering #043, Seoul National University, and Power of ElectronicsTeam of Samsung Electro-Mechanics Co. Ltd., pp. 769-773.

First office action, FLEX-03001CN: based on Application No. 200880004885.5 (based on PCT/US/2008/002054. Application entitled "leadframe Based Photo Voltaic Electronic Assembly" 4 pages.

Second Office Action, Patent Application No. 200880004885.5, Application Date: Feb. 13, 2008, Date of Issue: Dec. 23, 2011, 6 pages.

* cited by examiner

LEADFRAME BASED PHOTO VOLTAIC ELECTRONIC ASSEMBLY

CROSS-REFERENCE TO RELATED APPLICATIONS

This application claims priority under 35 U.S.C. §119(e) to Provisional U.S. Patent Application No. 60/901,377 filed Feb. 14, 2007 which is hereby incorporated by reference.

FIELD OF THE INVENTION

This invention relates generally to photovoltaic module assemblies. More specifically, it relates to photovoltaic module assemblies having concentrator lenses and/or mirrors.

BACKGROUND OF THE INVENTION

To achieve high efficiency of solar energy to electric power conversion, some current designs for the electronic portion of photovoltaic (PV) solar module uses non-silicon based semiconductors such as GaAs die on a Ge substrate. Other semiconductors such as CIGS or InP can also be used. These compound semiconductors are generally more efficient than their silicon based counterparts. Due to the higher efficiency, such PV cells can be made small. For even greatert efficiency, concentrator lenses, or optical rods, are used to concentrate incident sunlight on a large surface area onto to a small PV die. A concentrator type PV assembly can include mirrors are used to concentrate the incident solar light on the semiconductor device. Because of the high concentration solar energy, the module operates in a high-temperature environment. The temperature can be further exacerbated by the energy losses in conversion processes which result in additional heat generation. One solution uses BeO (Beryllium Oxide) to mount the substrate because of its high thermal conductivity. The thermal conductivity of the BeO allows heat in the semiconductor device to be thermally coupled, and then transport it to an external heat sink. However, BeO has a high cost and is toxic. Furthermore, BeO is an electrical insulator, and therefore metal traces, usually copper, are also formed on a BeO substrate using common Printed Circuit Board (PCB) techniques. Another element in the microelectronic assembly of the receiver is the need for tight tolerance and alignment of the optics to the semiconductor and substrate do the very high concentration of heat. The equipment and tooling necessary to accurately place concentrators is costly and requires dedicated operators, technicians and resources.

What is needed are devices and methods for minimizing the energy losses through the interconnect and for transferring heat from the electronic module to the ambient environment which can include the transfer of heat through the substrate to a heatsink and on to the environment. Further, what is needed is a solution with that does not include toxic material in the solution and yet has a good thermal conductivity. Further, what is needed is a cost effective method for assembling PV assemblies capable of accurate tolerances.

SUMMARY OF THE INVENTION

In one aspect of the invention, a mounting assembly for a photovoltaic device includes a metal substrate with a front surface and a back surface. A first mold compound encapsulates at least a portion of the metal substrate. At least one photovoltaic device, having an anode and a cathode, is coupled to the front surface of the metal substrate. A second mold compound encapsulates at least a portion of the first mold compound. The second mold compound has an having an opening configured to receive a solar concentrator. The solar concentrator is configured to concentrate light onto the at least one photovoltaic cell. The back surface of the metal substrate is able to be oxidized. The first and second mold compounds are able to be applied by commonly known and understood molding techniques. The mounting assembly can further comprise a protection diode. Also, the mounting assembly can in turn be mounted on an active or passive heat sink. Alternatively, it can be liquid cooled.

In another aspect of the invention, a method of assembling a photovoltaic device comprises applying a first mold compound to a metal substrate having a front and a back surface and encapsulating at least a portion of the metal substrate. At least one photovoltaic device is mounted on the front surface of the metal substrate. A second mold compound encapsulates at least a portion of the first mold compound, forming an opening in the second mold compound configured to receive a solar concentrator. A solar concentrator configured to concentrate light on the photovoltaic device is mounted to the metal substrate. In some embodiments, the first and second mold compounds can be applied using standard well known molding procedures. The method of assembling can also comprise the step of mounting the metal substrate onto a passive of active heat sink. In other embodiments, the method can comprise the step of liquid cooling the mounting assembly.

BRIEF DESCRIPTION OF THE SEVERAL DRAWINGS

DETAILED DESCRIPTION OF THE DRAWINGS

Embodiments of the present invention are directed to a photovoltaic assembly. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The drawings may not be to scale. The same reference indicators will be used throughout the drawings and the following detailed description to refer to the same elements. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
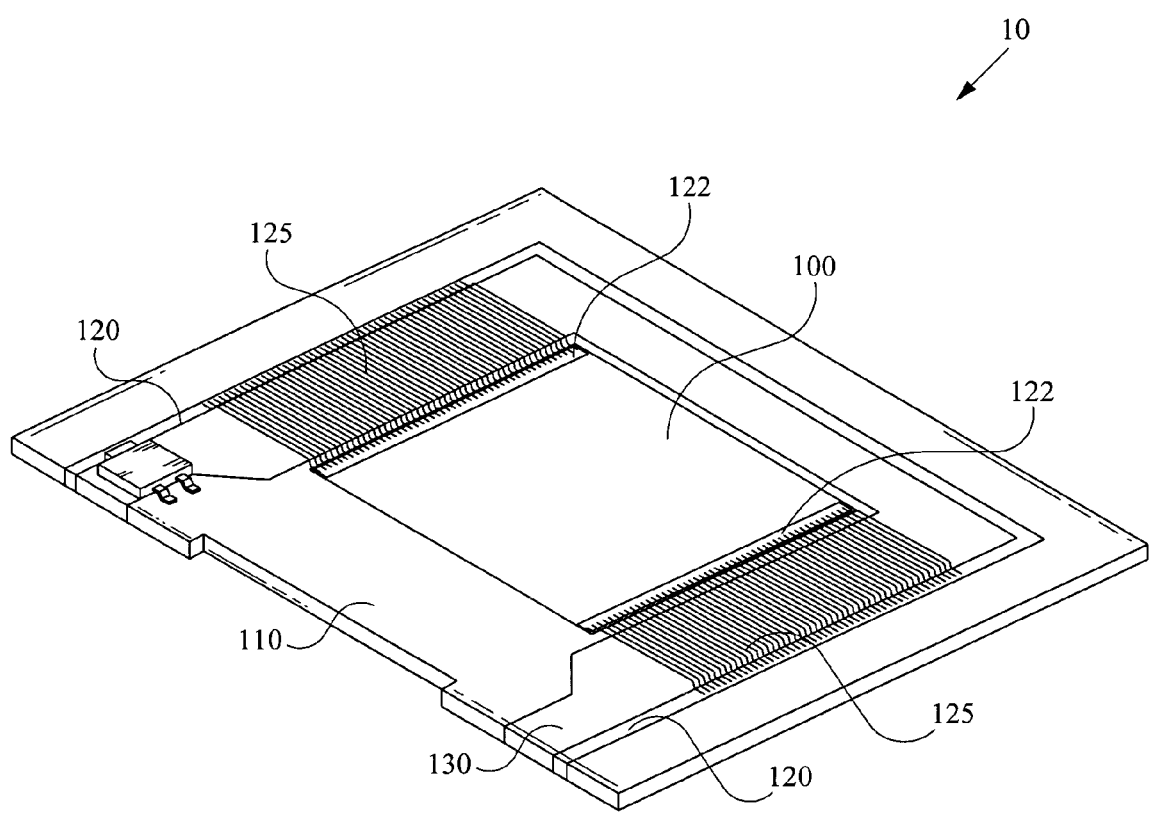
FIG. 1A shows the PV assembly with a first mold compound applied.

FIG. 1A shows the preferred PV assembly 10. A PV cell 100 is mounted on a metal substrate 110. The PV cell can be any among a list of, but not limited to, Silicon, Indium Phosphide, Gallium Arsenide, Cadmium Telluride, Copper Indium Gallium Selenide, Copper Indium Selenide, or any other bulk or thin film semiconductor capable of converting light energy into electric current. Preferably, the PV cell 100 is mounted with its negative terminal, or cathode coupled to the metal substrate 110 to effectuate a transfer of electric current from the PV cell 100 to the metal substrate 110. In some embodiments, the metal substrate is copper. The copper substrate is able to be manufactured using current, mature and well known leadframe processing technologies which exist in most semiconductor manufacturing environments. The copper substrate is able to be made substantially thick, on the order of several mils, to effectuate efficient transfer of substantial amounts of current and heat therethrough. Furthermore, given the maturity of the technology, such a substrate can be manufactured inexpensively. In contrast, forming copper traces of several mils in thickness on another substrate, such as BeO, is costly both because of the technology required to deposit such thick copper and the copper itself. Moreover, the BeO substrate itself, currently costs on the order of dozens of cents. In a very competitive market, such a starting cost is likely not acceptable.

The other side of the PV cell 100, the anode or positive terminal is exposed to sunlight preferably through a concentrator (not shown). Also, the anode is coupled to a current bus 120 via bondwires 125. Optionally, bus bars 122 can be included for efficient current transfer. The bus bars 122 may be copper, silver, or any substance with a high current carrying capability. In some embodiments, the copper substrate 110 is encapsulated at least in part by a first mold compound 130. The mold compound 130 can be any off-the-shelf mold compound commonly used in semiconductor packaging that has a high thermal conductivity and is a good electrical insulator. The first mold compound 130 can be applied using common and well understood semiconductor packaging techniques, such as molding a pattern of an area that is to be encapsulated. In some embodiments, the current bus 120 is be formed or mounted over the first mold compound 130 to electrically isolate it from the metal substrate 110. It is understood in the field of semiconductor packaging that such techniques are mature, widely available and have placement accuracies of 30 microns or better, which effectuates design and assembly of high tolerance PV assemblies at low cost. The first mold compound 130 in part serves to give rigidity to the copper substrate 110 and effectuate bonding for a second mold compound (not shown).

Figure 1B:
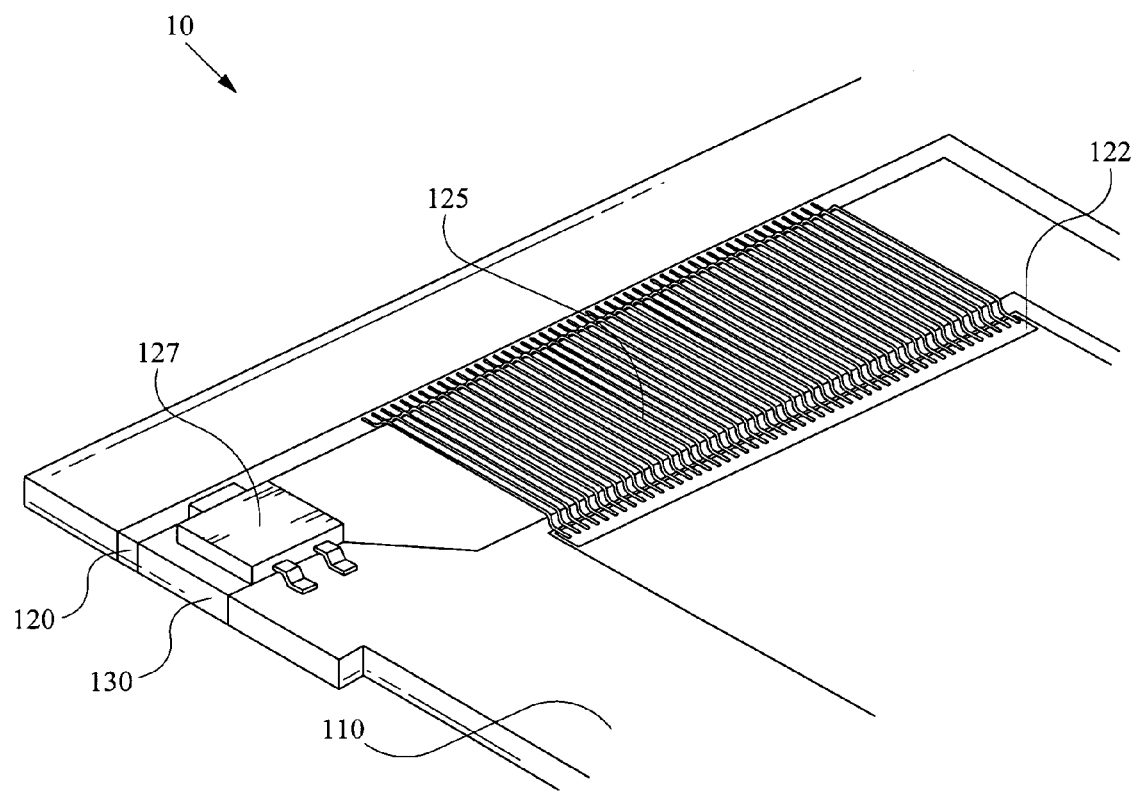
FIG. 1B shows a close up of the PV assembly of FIG. 1A.

A close up of the PV cell assembly 10 is shown in FIG. 1B. In some embodiments, the current bus 120 is a strip of copper is electrically isolated from the copper substrate 110. As is well known, the light hits the PV cell 100, electric current is generated and a circuit loop is formed from the current bus 120 through the bondwires 125, through the PV cell 100 and the copper substrate 110. Optionally, a protection diode 127 can be placed between the current bus 120 and the copper substrate 110.

Figure 1C:
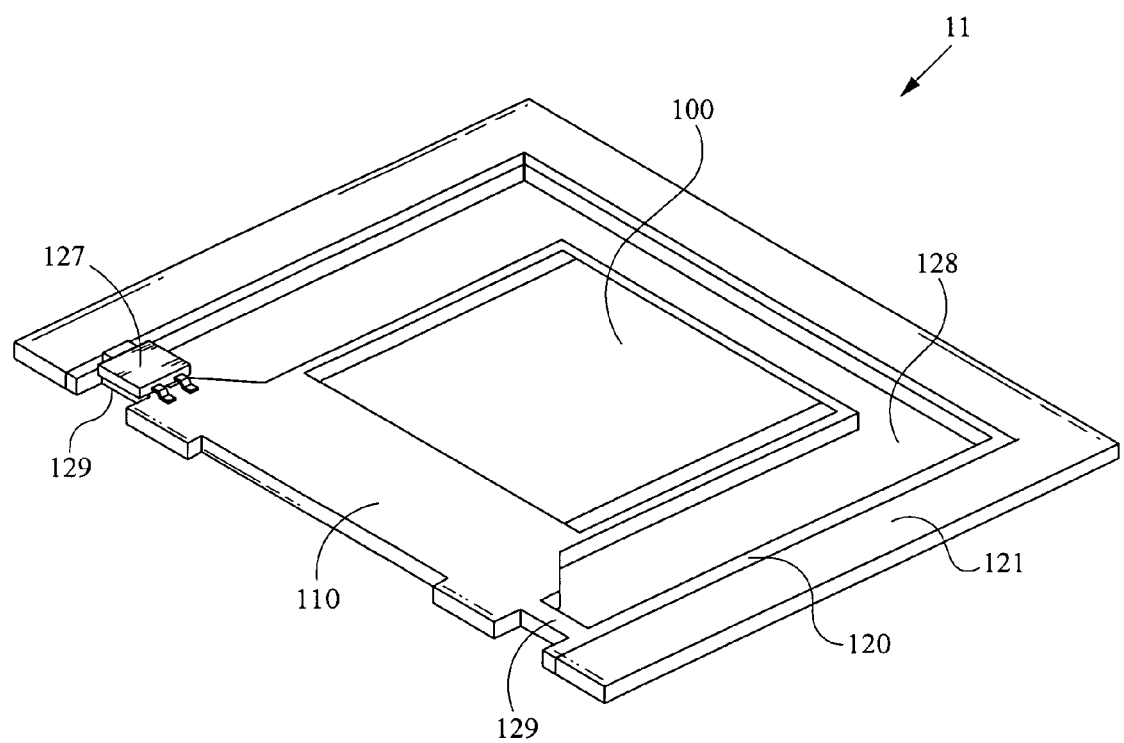
FIG. 1C shows an alternative embodiment of the PV assembly of FIG. 1A.

FIG. 1C shows an alternate construction for the PV assembly 11. This alternate assembly 11 comprises the copper substrate 110 and current bus 120, however a frame 121 is mechanically coupled to the copper substrate 110 by tie bars 129. Current semiconductor packaging assembly techniques routinely employ tie bars which hold a leadframe structure together during the assembly process. The first mold compound (not shown for clarity) fills in empty space 128 and encapsulates at least a portion of the copper substrate 110, lending rigidity to the assembly 11. The tie bars 129 are later cut to electrically isolate the substrate 110 from the current bus 120 and frame 121. A protection diode 127 further enhances electrical isolation.

Figure 2A:
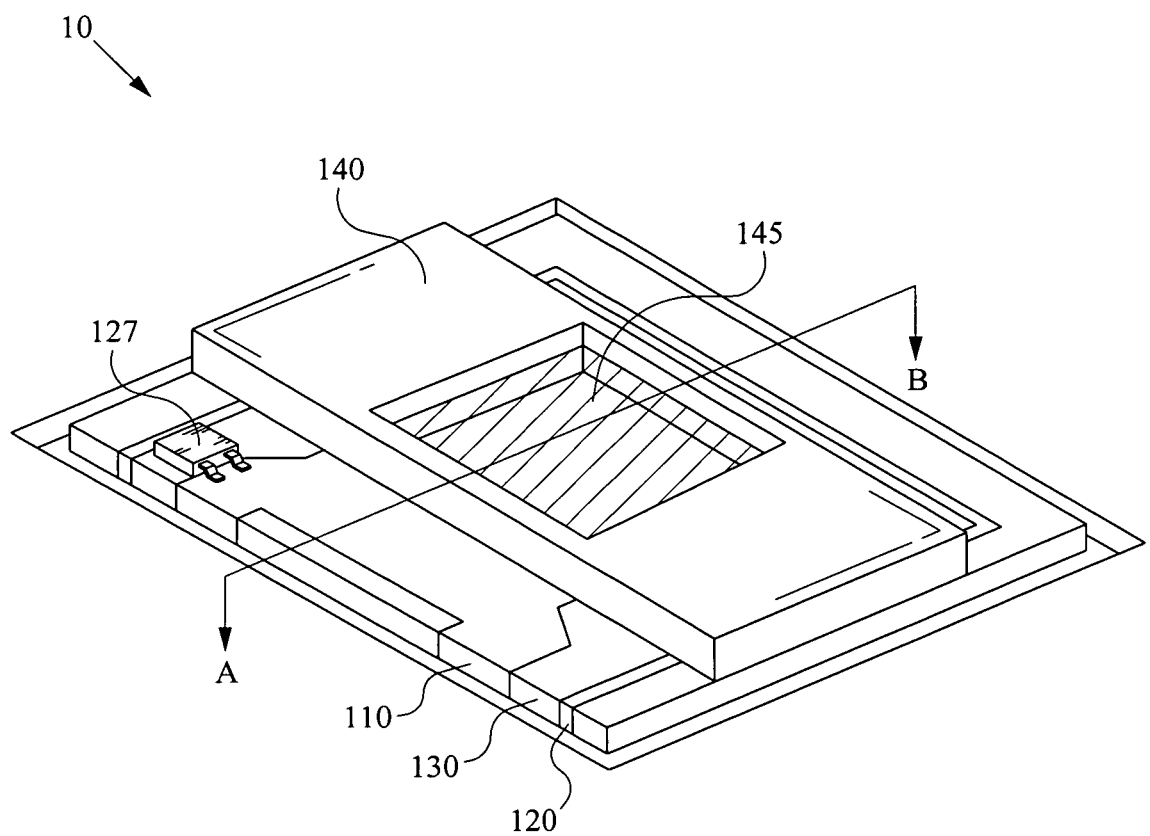
FIG. 2A shows the PV assembly with a second mold compound applied.
Figure 2B:
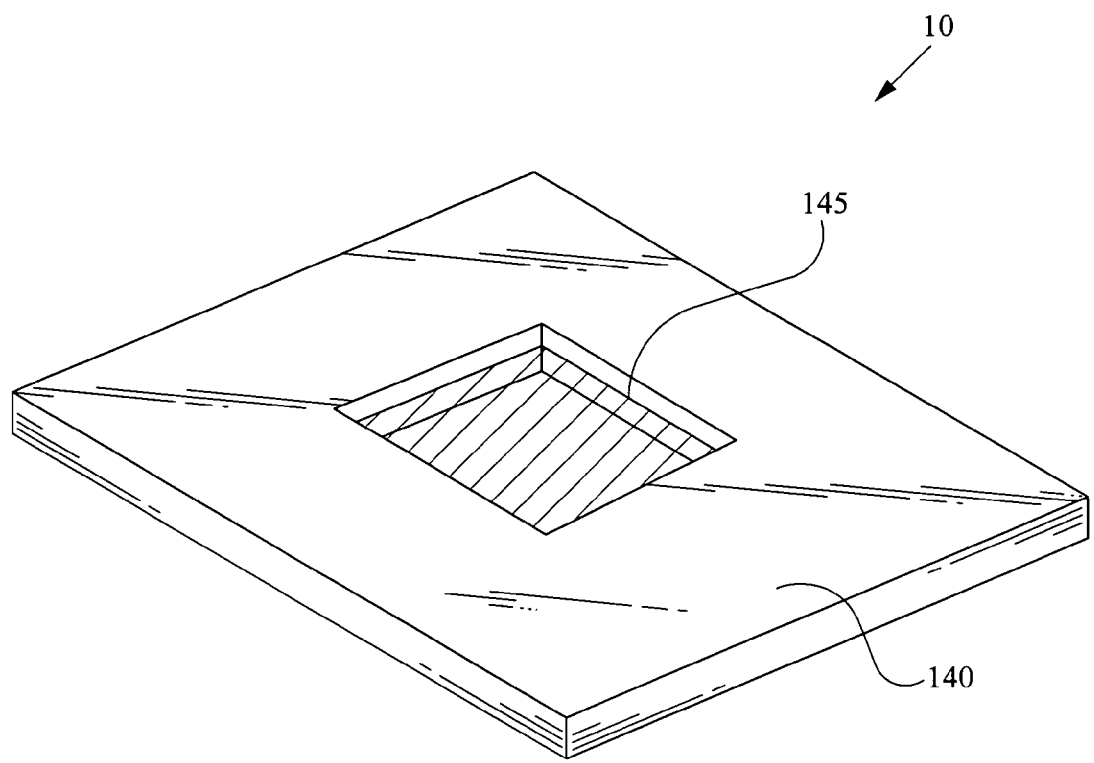
FIG. 2B shows an alternative embodiment of the assembly with the second mold compound applied.

FIG. 2A shows the assembly 10 depicted in FIGS. 1A, and 1B having a second mold compound 140 applied thereon. The second mold 140 is able to be applied such that it encapsulates at least a portion of the first mold 130, the copper substrate 110, and current bus 120. The second mold 140 also protects the bondwires (not shown). The second mold 140 preferably has an opening 145 coinciding with the anode surface of the PV cell 100. The opening 145 can be formed using standard masking techniques used in semiconductor packaging. Alternatively, the second mold compound 140 can encapsulate the entirety of the PV cell assembly 10 as shown in FIG. 2B. Such a configuration is desirable due to the enhanced rigidity added by the second mold 145 and because of the protection it offers to the components encapsulated.

Figure 2C:
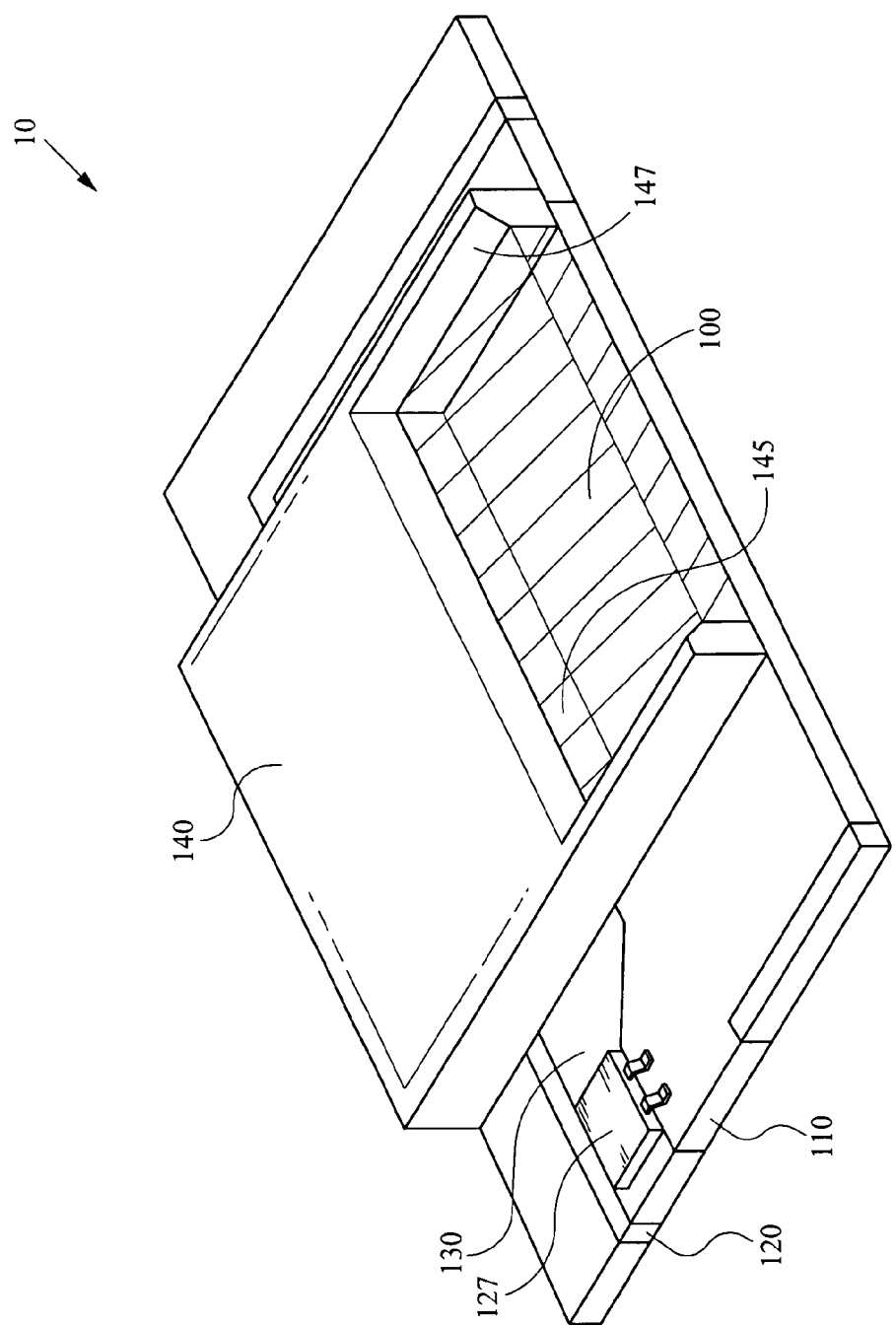
FIG. 2C shows a cross section of the PV assembly with the second mold compound applied.

FIG. 2C shows a cross section of the assembly 10 in FIG. 2A bisected along the line A-B. In some embodiments, the opening 145 has a beveled edge 147 configured to receive an optical concentrator or optical rod (not shown). Alternatively, the opening 145 is able to be formed in any desired predetermined shape to form a socket to receive a concentrator or optical rod. As a result of the high accuracy of a standard semiconductor packaging molding process discussed above, the opening 145 can be placed on top of the PV cell 100 to an accuracy of 30 microns or better without the need for additional technology development.

Figure 2D:
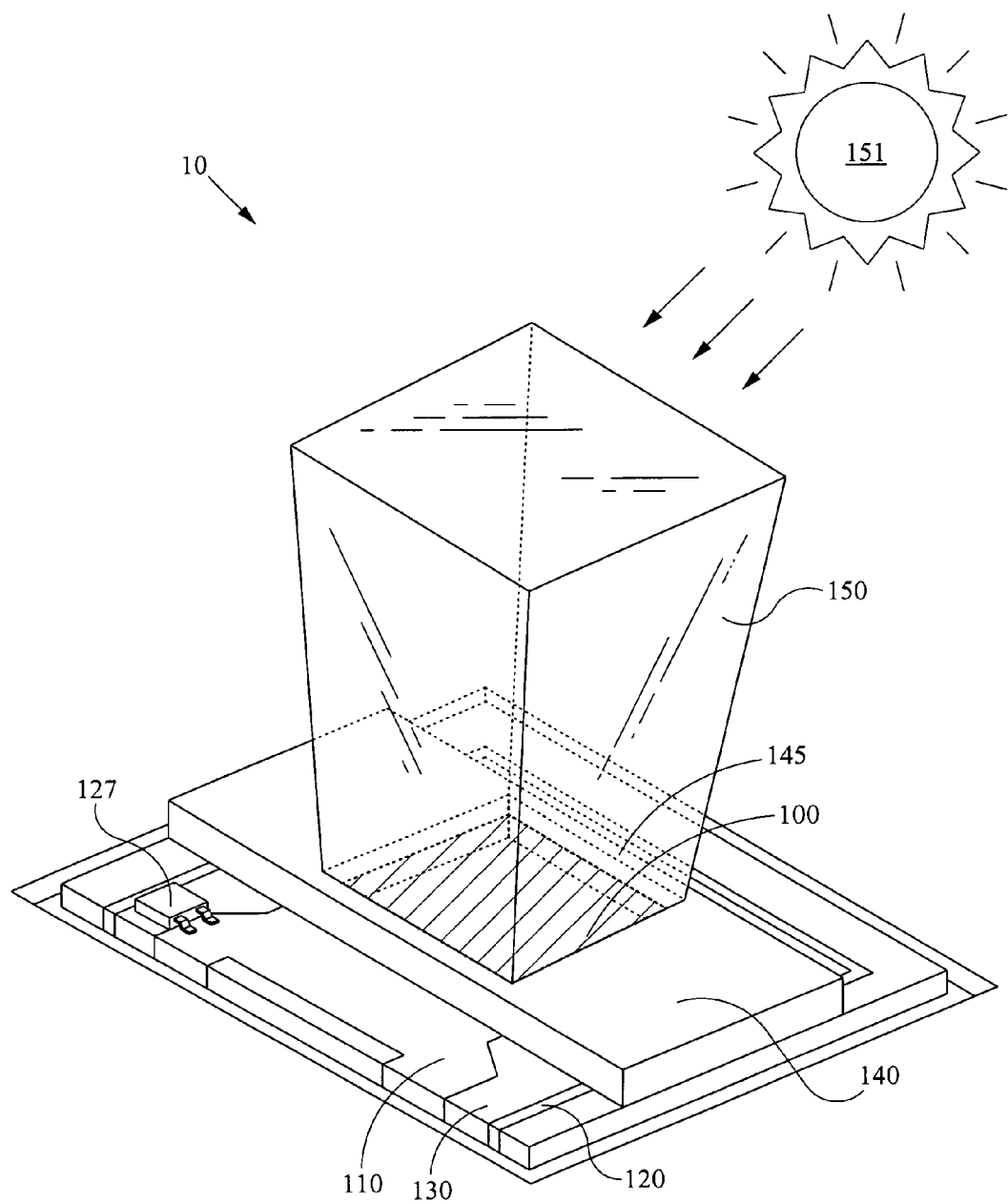
FIG. 2D shows the PV assembly mounted with a solar concentrator

FIG. 2D shows an exemplary optical rod 150 mounted in the opening 145. Preferably, the optical rod 150 is placed over the PV cell 100. The optical rod 150 is configured to receive sunlight 151 and concentrate the sunlight on to the PV cell 100. Design methods for optical rods for optimum concentration of sunlight are well understood by those of ordinary skill in the art.

Figure 3A:
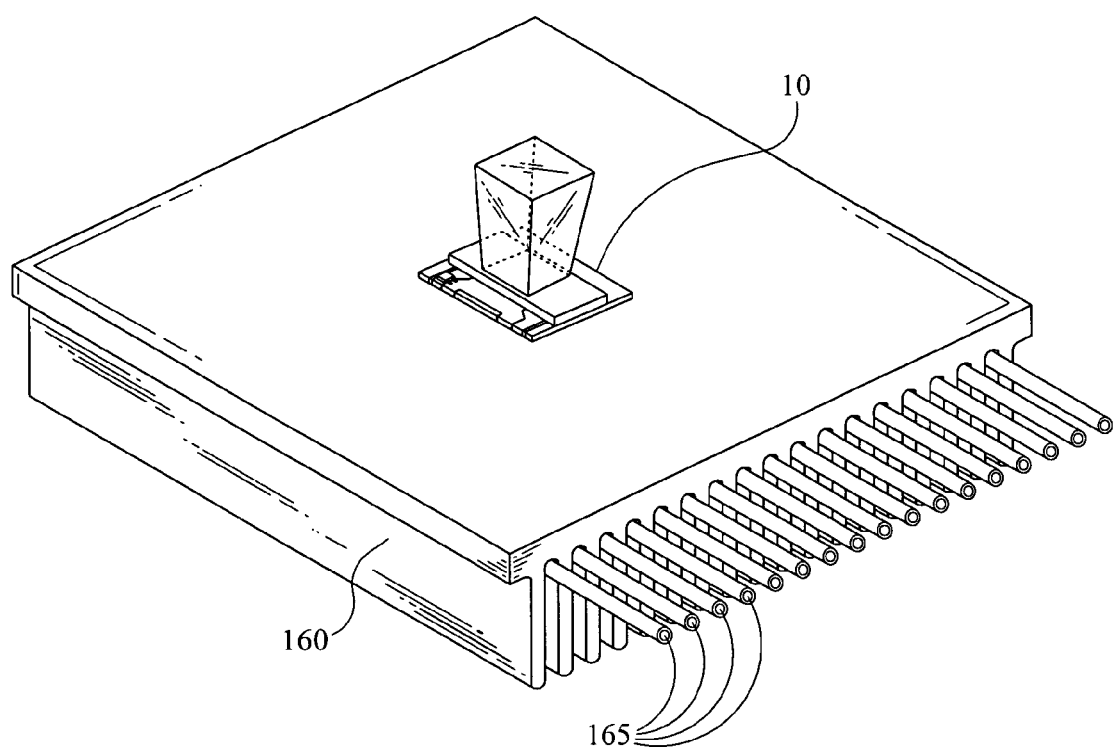
FIG. 3A shows the PV assembly mounted to a heat sink
Figure 3B:
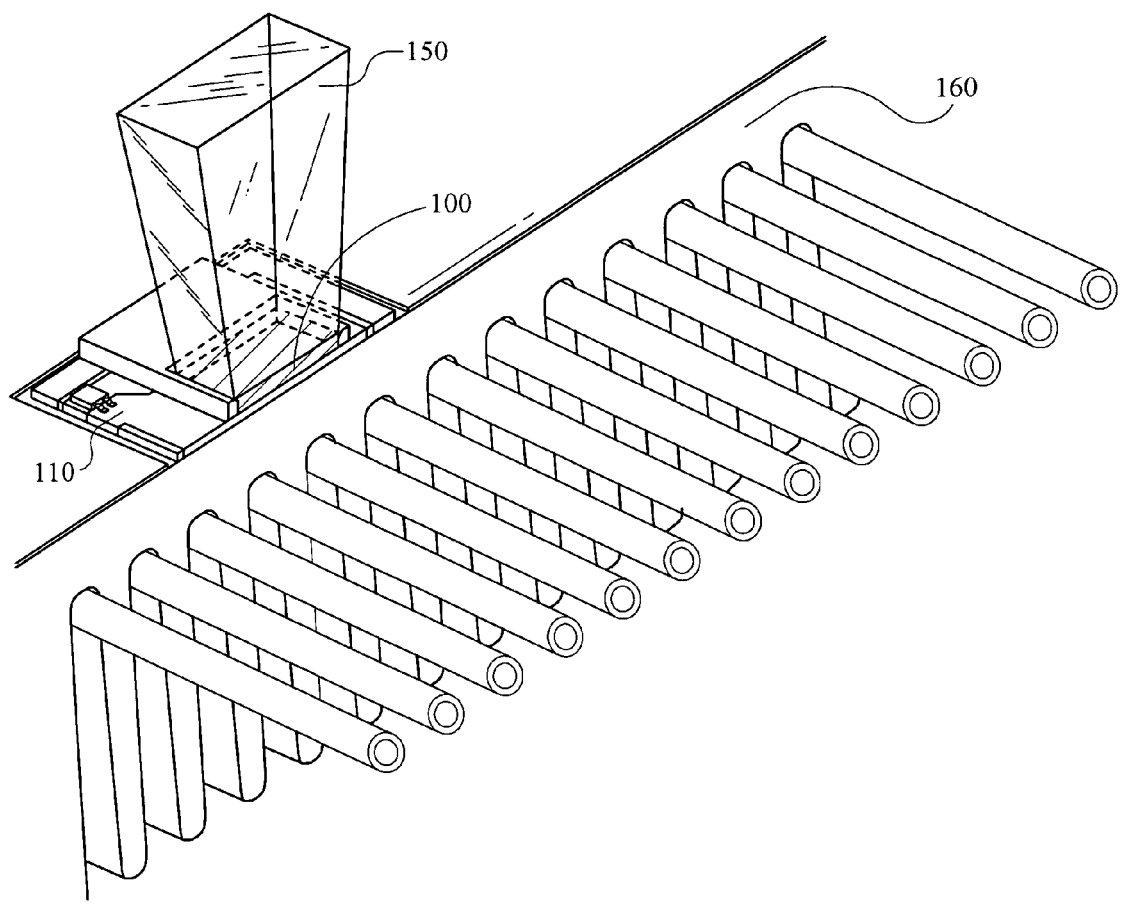
FIG. 3B shows a cross section of the PV assembly mounted to the heat sink.

In addition to concentration light energy from the sun 151, the optical rod 150 also concentrates heat that is preferably harvested away from the assembly 10 for optimum performance and durability. FIG. 3A shows the assembly 10 mounted to a heat sink 160. By way of example, a comb heat sink 160 is shown. Depending on the amount of waste heat and the speed with which it must be harvested, liquid cooling can be added by running liquid through tubing 165 between the fins of the heat sink 160. Alternatively the tubing 165 may be used to heat water for general use. Still alternatively, some current generated by the PV assembly 10 can be routed to an active cooling device, such as a fan or a thermoelectric cooling element, commonly known as a Peltier element. FIG. 3B shows a cross section of the assembly 10 on a heat sink 160 bisected across the line A-B in FIG. 3A. The copper substrate 110 is substantially thick to effectuate the transfer of waste heat collected as a byproduct of the optical rod 150. To further prevent electrical contact between the PV cell 100 and the heat sink 160, the back surface of the copper substrate 110 may be oxidized or covered with a high thermal conductivity mold compound. Furthermore, it can be appreciated by those of ordinary skill in the art that multiple PV assemblies may be placed on a heat sink after taking into consideration the amount of waste heat generated by the assemblies and the particular heat sink's ability to harvest the waste heat.

The present application has been described in terms of specific embodiments incorporating details to facilitate the understanding of the principles of construction and operation of the photovoltaic assembly. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A mounting assembly for a photovoltaic device comprising:
   a. a metal substrate having a front surface and a back surface;
   b. a current bus positioned lateral to the metal substrate;
   c. a first mold compound encapsulating at least a portion of the metal substrate, wherein the first mold compound and the metal substrate form a substantially planar surface and the first mold compound electrically isolates the metal substrate and the current bus such that the metal substrate forms a first electrode and the current bus forms a second electrode;
   d. at least one photovoltaic device mounted to the front surface of the metal substrate to effectuate transfer of current and heat therethrough, wherein the at least one photovoltaic device comprises an anode side on a first surface and a cathode side on a second surface opposite the first surface, and the cathode side is coupled to the first electrode and the anode side is electrically coupled to the second electrode, further wherein the second surface is entirely coupled to the metal substrate;
   e. a second mold compound encapsulating at least a portion of the first mold compound, the second mold compound having an opening sized to receive a solar concentrator; and
   f. a solar concentrator positioned within the opening of the second mold compound configured to concentrate light onto the anode side of the at least one photovoltaic cell.

2. The mounting assembly of claim 1 wherein the anode side of the photovoltaic device is coupled to at least one current bus by at least one bondwire to the second electrode.

3. The mounting assembly of claim 1 wherein the back surface of the metal substrate is oxidized.

4. The mounting assembly of claim 1 wherein the first mold compound is applied using a molding procedure.

5. The mounting assembly of claim 1 wherein the second mold compound is applied using a molding procedure.

6. The mounting assembly of claim 1 wherein the photovoltaic device is mounted on a non-encapsulated portion.

7. The mounting assembly of claim 1 further comprising a protection diode.

8. The mounting assembly of claim 1 wherein the mounting assembly is mounted on a passive heat sink.

9. The mounting assembly of claim 1 wherein the mounting assembly is mounted on an active heat sink.

10. The mounting assembly of claim 1 wherein the mounting assembly is liquid cooled.

11. A method of assembling a photovoltaic device comprising:
    a. stamping or etching a sheet metal to form a metal substrate and a current bus positioned lateral to the metal substrate;
    b. applying a first mold compound to the metal substrate having a front and a back surface and encapsulating at least a portion of the metal substrate and thereby electrically isolating the metal substrate and the current bus such that the metal substrate forms a first electrode and the current bus forms a second electrode;
    c. mounting at least one photovoltaic device having an anode side on a first surface and a cathode side on a second surface opposite the first surface such that the cathode side is mounted to the first electrode and the anode side is electrically coupled to the second electrode, and the second surface is entirely coupled to the metal substrate;
    d. applying a second mold compound and encapsulating at least a portion of the first mold compound;
    e. forming an opening in the second mold compound sized to receive a solar concentrator; and
    f. mounting a solar concentrator configured to concentrate light on the photovoltaic device, such that more than one surface of the solar concentrator is able to be exposed to the light before the light enters the solar concentrator.

12. The method of claim 11 further comprising cutting a tie bar to effectuate electrical isolation between the first electrode and second electrode.

13. The method of claim 11 wherein the back surface of the metal substrate is oxidized.

14. The method of claim 11 wherein the first mold compound is applied using a molding procedure.

15. The method of claim 11 wherein the second mold compound is applied using a molding procedure.

16. The method of claim 11 wherein the photovoltaic device is mounted on a non-encapsulated portion.

17. The method of claim 11 wherein further comprising a mounting a protection diode.

18. The method of claim 11 further comprising mounting the assembly on a passive heat sink.

19. The method of claim 11 further comprising mounting the assembly on an active heat sink.

20. The method of claim 11 further comprising mounting the assembly on a liquid cooling mechanism.

21. The mounting assembly of claim 1, wherein the solar concentrator comprises multiple outer surfaces and the solar concentrator is positioned so that the light enters the solar concentrator through the multiple outer surface.

22. The mounting assembly of claim 1 wherein the second electrode partially circumscribes the first electrode.

23. The method of claim 11 further comprising mounting bondwires from the anode of the photovoltaic device to the second electrode.

24. The mounting assembly of claim 1 wherein the first mold compound, the current bus, and the metal substrate form the substantially planar surface.

25. The mounting assembly of claim 1 wherein the current bus is formed over the first mold compound.

26. The mounting assembly of claim 1 wherein the second mold compound comprises an electrical insulator.

27. The mounting assembly of claim 2 wherein the second mold compound encapsulates the at least one bondwire.

* * * * *